United States Patent [19]

Tajima et al.

[11] Patent Number: 4,900,588
[45] Date of Patent: Feb. 13, 1990

[54] METHOD FOR THE PRODUCTION OF A CARBON ELECTRODE

[75] Inventors: Yoshimitsu Tajima; Motoo Mohri, both of Nara; Hideaki Tanaka, Tenri, all of Japan

[73] Assignee: Sharp Kabushiki Kaisha, Osaka, Japan

[21] Appl. No.: 119,115

[22] Filed: Nov. 10, 1987

[30] Foreign Application Priority Data

Nov. 11, 1986 [JP] Japan ............... 61-269426

[51] Int. Cl.⁴ .............. B05D 5/12; C23C 16/26
[52] U.S. Cl. ................... 427/122; 427/249; 427/289; 427/365
[58] Field of Search ............ 427/122, 249, 289, 293, 427/365

[56] References Cited

U.S. PATENT DOCUMENTS

| | | | |
|---|---|---|---|
| 2,289,339 | 7/1942 | Brennan | 427/365 |
| 3,238,054 | 3/1966 | Bickerdike et al. | 427/122 |
| 3,399,451 | 9/1968 | Smith-Johannsen | 427/122 |
| 3,429,020 | 2/1969 | Diefendorf | 427/122 |
| 3,477,940 | 11/1969 | Grangaard | 427/122 |
| 3,629,774 | 12/1971 | Crites | 427/122 |
| 3,970,768 | 7/1976 | Wilcox et al. | 427/122 |
| 4,120,080 | 10/1978 | Krol et al. | 427/122 |
| 4,136,213 | 1/1979 | Fung et al. | 427/122 |
| 4,504,519 | 3/1985 | Zelez | 427/122 |

OTHER PUBLICATIONS

Blaedel et al., "Pyolytic Carbon Film Electrode", Analytical Chemistry, vol. 50, No. 7, pp. 933-936, Jun. 1978.
S. L. Deshpande et al., *J. Electrochem Soc* (1978) 125: 687-692.
Y. Onuma et al., *Jpn J. Appl. Phys* (1983) 22:888-889.

*Primary Examiner*—Sadie Childs
*Attorney, Agent, or Firm*—Irell & Manella

[57] ABSTRACT

A method for the production of a carbon electrode comprising disposing an electroconductive and flexible electrode substrate within a reaction tube to which a gaseous material gas of hydrocarbons is supplied, directly depositing a carbon material on said electrode substrate by chemical vapor deposition at 1500° C. or less so as to coat said electrode substrate with a carbon material, and rolling said electrode substrate coated with the carbon material, resulting in a thin-plate shaped carbon electrode having a high density.

3 Claims, 1 Drawing Sheet

METHOD FOR THE PRODUCTION OF A CARBON ELECTRODE

DESCRIPTION OF THE INVENTION

1. Field of the Invention

This invention relates to a method for the production of a carbon electrode that is useful for thin-type batteries suitable for power supplies of various electronic equipment intended to be miniaturized and thinned. Especially, it relates to a method for the production of a thin electrode having a high energy density.

2. Description of the Prior Art

For conventional thin-type batteries for electronic equipment, a battery structure is widely used wherein an electroconductive material and a binder are admixed with an electrode active material (e.g., metal oxide or carbon powder) and the mixture is coated on a current-collector such as a metal net so as to form an electrode, and the electrode is disposed opposite to a counter electrode in a manner to dispose a separator between these electrodes.

However, the electrode manufactured by the above-mentioned method is disadvantageous in that electric contact of the electrode active material with the electroconductive material or the current-collector is poor, resulting in a decrease in the battery's capacity. Moreover, the electroconductive material and the binder are required in addition to the electrode active material, therefore resulting in a decrease in energy density, which causes complication of the manufacturing process.

SUMMARY OF THE INVENTION

The method for the production of a carbon electrode of this invention, which overcomes the abovediscussed and numerous other disadvantages and deficiencies of the prior art, comprises disposing an electroconductive and flexible electrode substrate within a reaction tube to which a gaseous material gas of hydrocarbons is supplied, directly depositing a carbon material on said electrode substrate by chemical vapor deposition at 1500° C. or less so as to coat said electrode substrate with a carbon material, and rolling said electrode substrate coated with the carbon material resulting in a thin-plate shaped carbon electrode having a high density.

In a preferred embodiment, the electrode substrate is a three-dimensional structured substance.

In a preferred embodiment, the three-dimensional structured substance is metal sponge, woven cloth of metal fibers, nonwoven cloth of metal fibers, or metal net.

Thus, the invention described herein makes possible the objective of (1) providing a method for the production of a carbon electrode in which a decrease in the battery's capacity due to a poor electric contact of the electrode active material with the electroconductive material or the current-collector can be avoided; (2) providing a method for the production of a carbon electrode in which the carbon material as an active material is deposited on an electrode substrate by chemical vapor deposition on without binders, thereby producing an electrode having a desired thickness and a high energy density and thereby simplifying the production process of the battery; (3) providing a method for the production of a carbon electrode in which the carbon material as an active material is directly deposited on an electrode substrate and compressed, resulting in a uniformly thin plate electrode that is suitable for an electrode of thin-type batteries; and (4) providing a method for the production of a carbon electrode in which the carbon material as an active material is directly deposited on an electrode substrate and compressed so that the density of the carbon material can be made higher resulting in an electrode for batteries having a large battery capacity and a high energy density.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
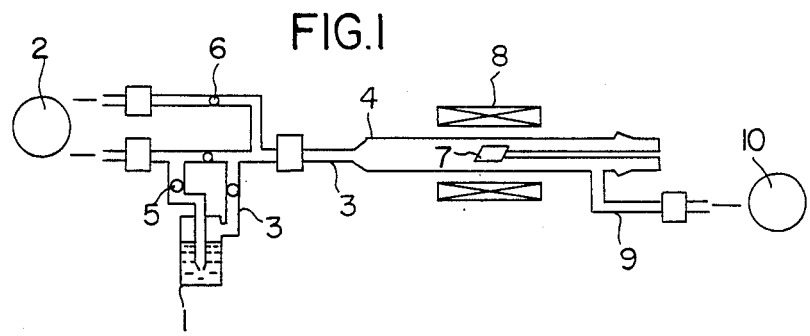
FIG. 1 is a schematic diagram showing an apparatus for the deposition of a carbon material that is used in the method for the production of a carbon electrode of this invention.

The electrode substrate on which a carbon active material is deposited by vapor phase epitaxy is a three-dimensional structured substance, which can be of any shape such as a sponge shape, wool shape, wovencloth shape, nonwoven-cloth shape, net shape, etc., but must have flexibility capable of changing shape due to compression resulting from the application of an external pressure thereto and electroconductivity. Specific examples thereof are metal sponge, woven or nonwoven cloth of metal fibers, metal net, or the like. The thickness thereof is determined based on the degree of the thickness of a desired battery (particularly, a thin-type battery) and the compressibility of the said three-dimensional structured substance.

The carbon electrode of this invention can be obtained by coating the three-dimensional structured substance with a carbon material (i.e., an electrode active material) and compressing the said coated substance. The carbon material is deposited on the three-dimensional structured substance by chemical vapor deposition at 1500° C. or less using gaseous hydrocarbons as a gaseous material, examples of which are aliphatic hydrocarbons (preferably, unsaturated hydrocarbons), aromatic hydrocarbons, and alicylic hydrocarbons. These can have substituents, examples of which are halogens, hydroxyl groups, sulfo groups, nitro groups, nitroso groups, amino groups, carboxy groups. Specific examples thereof are benzene, naphthalene, anthracene, hexamethylbenzene, 1,2-dibromobenzene, 2-butyne, acetylene, biphenyl, diphenylacetylene, etc., Aromatic hydrocarbons such as benzene, etc., are preferably used. Although the concentration and temperature of hydrocarbon compounds in the atmosphere to be thermally decomposed depend upon the kind of starting hydrocarbon compounds, they are usually set to be several millimolar percent and about 1000° C., respectively. A typical method for the vaporization of hydrocarbons is the bubbling method in which argon gas is used as a carrier gas. The bubbling method using hydrogen gas or a mixture of hydrogen gas and argon gas can be also used. Evaporation, sublimation, etc., can also be employed.

By the above-mentioned method for the vaporization of the hydrocarbons, a carbon material (i.e., an electrode active material) is directly deposited on the surface of the three-dimensional structured substance. In this way, the three-dimensional structured substance coated with the carbon material is obtained. The amount of coating carbon material is preferably in the range of about 1 to about 10 mg/cm$^2$.

The above-mentioned three-dimensional structured substance coated with the carbon material is preferably rolled by means of rollers, but it can be also compressed by a press forming machine or other pressing means. The compressing thereof is determined depending upon the thickness of a thin-type battery to which the resulting carbon electrode is applied. It is usually set such that the final thickness becomes $\frac{1}{2}$ to 1/10 times the original thickness of the said coated substance. If a binding agent (e.g., a cellulose dispersion) is coated, in advance, on the three-dimensional structured substance that is to be coated with the carbon material, the binding strength of the carbon material to the three-dimensional structured substance can be maintained at a fixed level even after the compression operation is performed.

The resulting thin-plate shaped carbon electrode is constituted of an electrode substrate with a high density obtained by compressing the electroconductive and flexible three-dimensional structured substance and a compressed carbon material film with a high density directly placed on the said compressed three-dimensional structured substance. The carbon electrode is cut in a predetermined size and each piece is used as an electrode of batteries, particularly thin-type batteries. This carbon electrode can be used either as an anode or a cathode. When the deposition conditions (e.g., the thickness of the carbon material, etc.) of the carbon material are adjusted to fixed levels, a carbon electrode that is optimum for the particular anode or cathode functions needed can be obtained.

In the case where the carbon electrode of this invention is used as the anode for the cathode as a counter electrode, oxides such as manganese dioxide, vanadium pentoxide, chromium trioxide, molybdenum trioxide, etc., chalcogen compounds such as titanium disulfide, tantalum disulfide, tantalum selenide, etc., a mixture thereof, or a complex thereof; and electroconductive polymer compounds such as polyacetylene, polyacene etc., can be used. In the case where the carbon electrode is used as the cathode, for the anode as a counter electrode, simple light metals such as lithium, sodium, potassium, etc., light metal alloys such as lithiumaluminum alloy, Wood's metal or the like, etc., can be used. The carbon electrode of this invention is, of course, applicable to both the anode and the cathode. As an electrolyte, a solution of non-proton organic solvent such as propylene carbonate, dimethoxyethane, etc., containing lithium perchlorate, lithium borofluoride, lithium hexafluoroarsenate, etc., or an acid aqueous solution, an alkaline aqueous solution, etc., containing protons or the like as charge carriers can be used.

EXAMPLE

The direct deposition of the carbon material (i.e., an electrode active material) on the electrode substrate was performed, using a reaction apparatus shown in FIG. 1, as follows: To a vessel 1, which contained benzene that had been dehydrated and refined by vacuum distillation, argon gas was supplied from an argon gas supplier 2 so as to bubble the benzene. Then, the benzene was supplied to a quartz reaction tube 4 through a Pyrex glass tube 3. At this time, the vessel was heated to compensate for energy loss due to evaporation of the benzene, so that the liquid benzene in the vessel 1 could be maintained at a fixed temperature, and the flow rate of the argon gas was controlled by valves 5 and 6 so that the amount of benzene to be supplied into the reaction tube 4 could be controlled at a fixed level. In the reaction tube 4, there was provided a sample holder 7 on which a three-dimensional structured substance (the length, width and thickness thereof being 50 mm, 50 mm and 1.5 mm, respectively) that is made of foamed nickel was placed. There was a furnace 8 surrounding the outside of the reaction tube 4. This furnace 8 kept the holder 7 and the three-dimensional structured substance on the holder at about 1000° C. When benzene was supplied into the reaction tube 4 through the Pyrex glass tube 3, the benzene was thermally-decomposed within the reaction tube 4. The thermally-decomposed benzene was deposited as a carbon material (the thickness thereof being about 1μm) on the whole area of the three-dimensional structured substance taking 60 minutes. The gas remaining in the reaction tube 4 was removed via gas-ejection systems 9 and 10.

Figure 2:
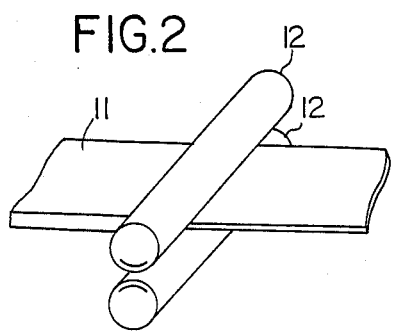
FIG. 2 is a perspective view showing a rolling process by which a three-dimensional structured substance coated with the carbon material is rolled.

In this way, the carbon material that is an electrode active material was directly deposited on the substrate, resulting in an electrode substance. As shown in FIG. 2, the electrode substance 11 was then rolled by rollers 12 and cut into pieces of a predetermined shape, resulting in a carbon electrode.

Table 1 shows various physical properties of the carbon electrode obtained above and other carbon electrodes obtained likewise using other electrode substrates.

TABLE 1

| No. | Electrode substrate prior to the deposition of carbon material | | Compression formation pressure (tcm$^{-2}$) | Electrode after compression formation | | Density of discharging capacity of electrode (mAbcm$^{-3}$) |
|---|---|---|---|---|---|---|
| | Material | Thickness (mm) | | Thickness (mm) | Density (gcm$^{-3}$) | |
| 1 | Foamed nickel | 1.5 | 0.44 | 0.300 ± 0.010 | 3.0 ± 0.1 | 62 |
| 2 | Foamed nickel | 1.5 | 2.07 | 0.210 ± 0.010 | 4.3 ± 0.1 | 90 |
| 3 | Foamed nickel | 3.0 | 0.46 | 0.540 ± 0.010 | 3.6 ± 0.1 | 55 |
| 4 | Foamed nickel | 3.0 | 1.84 | 0.370 ± 0.010 | 5.2 ± 0.1 | 78 |
| 5 | Wool-shaped nickel | 2.0 | 0.84 | 0.130 ± 0.020 | 1.7 ± 0.3 | 41 |
| 6 | Wool-shaped copper | 2.0 | 1.0 | 0.170 ± 0.020 | 2.9 ± 0.3 | 33 |
| 7 | Nickel net | 0.15 | 2.07 | 0.085 ± 0.005 | 4.3 ± 0.2 | 81 |
| 8 | Nickel net | 0.15 | 4.13 | 0.072 ± 0.005 | 5.0 ± 0.4 | 96 |

TABLE 1-continued

| | Electrode substrate prior to the deposition of carbon material | | Compression formation pressure (tcm$^{-2}$) | Electrode after compression formation | | Density of discharging capacity of electrode (mAbcm$^{-3}$) |
|---|---|---|---|---|---|---|
| No. | Material | Thickness (mm) | | Thickness (mm) | Density (gcm$^{-3}$) | |
| 9 | Copper net | 0.27 | 0.91 | 0.165 ± 0.005 | 4.2 ± 0.1 | 45 |
| 10 | Copper net | 0.27 | 1.8 | 0.140 ± 0.005 | 5.0 ± 0.2 | 57 |

Figure 3:
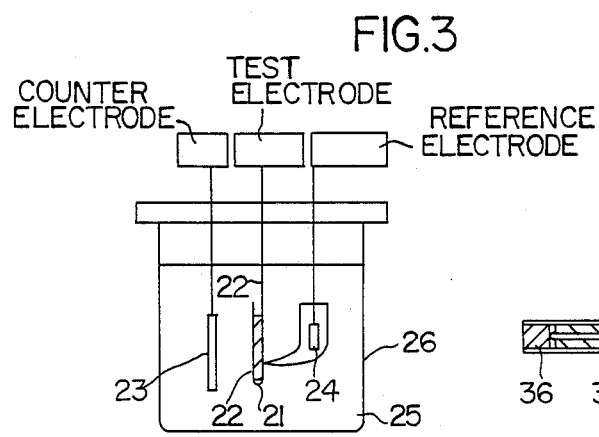
FIG. 3 is a schematic diagram showing an electrolytic cell that is used to determine the discharging capacity of the carbon electrode of this invention.

In Table 1, the discharging capacity of electrodes was determined by the triode method using an electrolytic cell 26 shown in FIG. 3, wherein a test electrode 21 was fixed by a current-collecting rod 22 and lithium electrodes were used for a counter electrode 23 and a reference electrode 24, and an electrolyte 25 was a solution of propylene carbonate containing 1M lithium perchlorate. The discharging capacity of the electrode 21 was calculated from the discharged amount of electricity at the time when this electrode was discharged to 2.5 volts after it was charged to the potential that was zero volts with respect to the reference electrode 24 and the discharged amount of electricity at the time when it was discharged to 2.0 volts after it was charged to a potential equal to 4.3 volts. The experiments were performed in a glove box capable of maintaining argon atmosphere therein.

The data of Table 1 indicate that each of the carbon electrodes of this invention has an excellent discharging capacity despite the thin thickness thereof.

Figure 4:
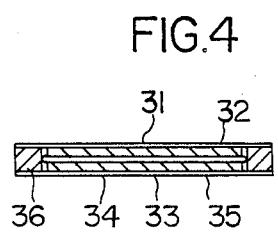
FIG. 4 is a front sectional view showing a thin-type battery constituted by the use of the carbon electrode of this invention.

A thin-type battery as shown in FIG. 4 was fabricated using the carbon electrode 31 obtained above, the counter electrode 33 thereof and a separator 35 holding an electrolyte therein. Reference numerals 32 and 34 are electrode plates for the carbon electrode 31 and the counter electrode 33, respectively. Reference numeral 36 is a sealing substance.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for the production of a carbon electrode comprising disposing an electroconductive and flexible electrode substrate within a reaction tube to which a gaseous hydrocarbon is supplied, directly depositing a carbon material on said electrode substrate by chemical vapor deposition at 1500° C. or less so as to coat said electrode substrate with the carbon material, and rolling said electrode substrate coated with the carbon material, resulting in a thin-plate shaped carbon electrode having a high density.

2. A method for the production of a carbon electrode according to claim 1, wherein said electrode substrate is a three-dimensional structured substance.

3. A method for the production of a carbon electrode according to claim 2, wherein said three-dimensional structured substance is metal sponge, woven cloth of metal fibers, nonwoven cloth of metal fibers, or metal net.

* * * * *